US010236268B1

(12) United States Patent
Dhandapani et al.

(10) Patent No.: US 10,236,268 B1
(45) Date of Patent: Mar. 19, 2019

(54) ROBUST PILLAR STRUCTURE FOR SEMICONDCUTOR DEVICE CONTACTS

(71) Applicant: Amkor Technology, Inc., Tempe, AZ (US)

(72) Inventors: Karthikeyan Dhandapani, Chandler, AZ (US); Ahmer Syed, Chandler, AZ (US); Sundeep Nand Nangalia, Raleigh, NC (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/285,110

(22) Filed: Oct. 4, 2016

Related U.S. Application Data

(63) Continuation of application No. 13/903,468, filed on May 28, 2013, now Pat. No. 9,484,291.

(51) Int. Cl.
*H01L 25/00* (2006.01)
*H01L 23/00* (2006.01)

(52) U.S. Cl.
CPC .............. *H01L 24/13* (2013.01); *H01L 24/02* (2013.01); *H01L 24/04* (2013.01); *H01L 24/05* (2013.01); *H01L 24/10* (2013.01); *H01L 24/11* (2013.01); *H01L 2224/0239* (2013.01); *H01L 2224/0401* (2013.01); *H01L 2224/05666* (2013.01); *H01L 2224/05684* (2013.01); *H01L 2224/10126* (2013.01); *H01L 2224/11001* (2013.01); *H01L 2224/11013* (2013.01); *H01L 2224/11472* (2013.01); *H01L 2224/11474* (2013.01); *H01L 2224/13006* (2013.01); *H01L 2224/13008* (2013.01); *H01L 2224/13017* (2013.01); *H01L 2224/13018* (2013.01); *H01L 2224/13076* (2013.01); *H01L 2224/13083* (2013.01); *H01L 2224/13147* (2013.01); *H01L 2924/01029* (2013.01)

(58) Field of Classification Search
CPC ........................................................ H01L 24/13
See application file for complete search history.

(56) References Cited

U.S. PATENT DOCUMENTS 5,508,561 A 4/1996 Tago et al.
7,569,935 B1 8/2009 Fan
(Continued)

*Primary Examiner* — William Harriston
(74) *Attorney, Agent, or Firm* — McAndrews, Held & Malloy, Ltd.

(57) ABSTRACT

Methods and systems for a robust pillar structure for a semiconductor device contacts are disclosed, and may include processing a semiconductor wafer comprising one or more metal pads, wherein the processing may comprise: forming a second metal contact on the one or more metal pads; forming a pillar on the second metal contact, and forming a solder bump on the second metal contact and the pillar, wherein the pillar extends into the solder bump. The second metal contact may comprise a stepped mushroom shaped bump, a sloped mushroom shaped bump, a cylindrical post, and/or a redistribution layer. The semiconductor wafer may comprise silicon. A solder brace layer may be formed around the second metal contact. The second metal contact may be tapered down to a smaller area at the one or more metal pads on the semiconductor wafer. A seed layer may be formed between the second metal contact and the one or more metal pads on the semiconductor wafer. The pillar may comprise copper.

22 Claims, 14 Drawing Sheets

(56) References Cited

U.S. PATENT DOCUMENTS

| | | |
|---|---|---|
| 8,552,557 B1 | 10/2013 | Nangalia |
| 8,568,961 B2 | 10/2013 | Stapleton |
| 2002/0027269 A1* | 3/2002 | Hashimoto ......... H01L 23/3114 257/669 |
| 2003/0214795 A1* | 11/2003 | Sakuyama .............. H01L 24/11 361/767 |
| 2005/0116340 A1* | 6/2005 | Shindo .................... H01L 24/03 257/737 |
| 2005/0186771 A1* | 8/2005 | Tanida .................... H01L 24/03 438/614 |
| 2006/0087034 A1 | 4/2006 | Huang et al. |
| 2006/0220259 A1 | 10/2006 | Chen et al. |
| 2010/0044863 A1* | 2/2010 | Kasai .................. H01L 23/3114 257/738 |
| 2011/0115074 A1* | 5/2011 | Hu ......................... H01L 24/11 257/737 |
| 2012/0061823 A1 | 3/2012 | Wu et al. |
| 2012/0181688 A1* | 7/2012 | Hsu ....................... H01L 23/498 257/737 |

\* cited by examiner

ROBUST PILLAR STRUCTURE FOR SEMICONDCUTOR DEVICE CONTACTS

CLAIM OF PRIORITY/INCORPORATION BY REFERENCE

This patent application is a continuation of U.S. patent application Ser. No. 13/903,468 filed on May 28, 2013, issued on Nov. 1, 2016 as U.S. Pat. No. 9,484,291, which is hereby incorporated herein by reference in its entirety.

FIELD OF THE INVENTION

Certain embodiments of the invention relate to semiconductor devices. More specifically, certain embodiments of the invention relate to methods and systems for a robust pillar structure for semiconductor device contacts.

BACKGROUND OF THE INVENTION

Semiconductor device contacts provide electrical connections between structures such as an integrated circuit die and a packaging substrate. Contacts can also provide a thermal conductance path to efficiently remove heat generated in a chip. Thermal stresses from heat generated in semiconductor die can damage these contacts.

Further limitations and disadvantages of conventional and traditional approaches will become apparent to one of skill in the art, through comparison of such systems with the present invention as set forth in the remainder of the present application with reference to the drawings.

DETAILED DESCRIPTION OF THE INVENTION

Certain aspects of the invention may be found in methods and systems for a robust pillar structure for semiconductor device contacts. Example aspects of a method in accordance with an embodiment of the invention may comprise processing a semiconductor wafer comprising one or more metal pads, wherein the processing may comprise: forming a second metal contact on the one or more metal pads; forming a pillar on the second metal contact, and forming a solder bump on the second metal contact and the pillar, wherein the pillar extends into the solder bump. The second metal contact may comprise a stepped mushroom shaped bump, a sloped mushroom shaped bump, a cylindrical post, and/or a redistribution layer. The semiconductor wafer may comprise silicon. A solder brace layer may be formed around the second metal contact. The second metal contact may be tapered down to a smaller area at the one or more metal pads on the semiconductor wafer. A seed layer may be formed between the second metal contact and the one or more metal pads on the semiconductor wafer. The pillar may comprise copper.

Figure 1:
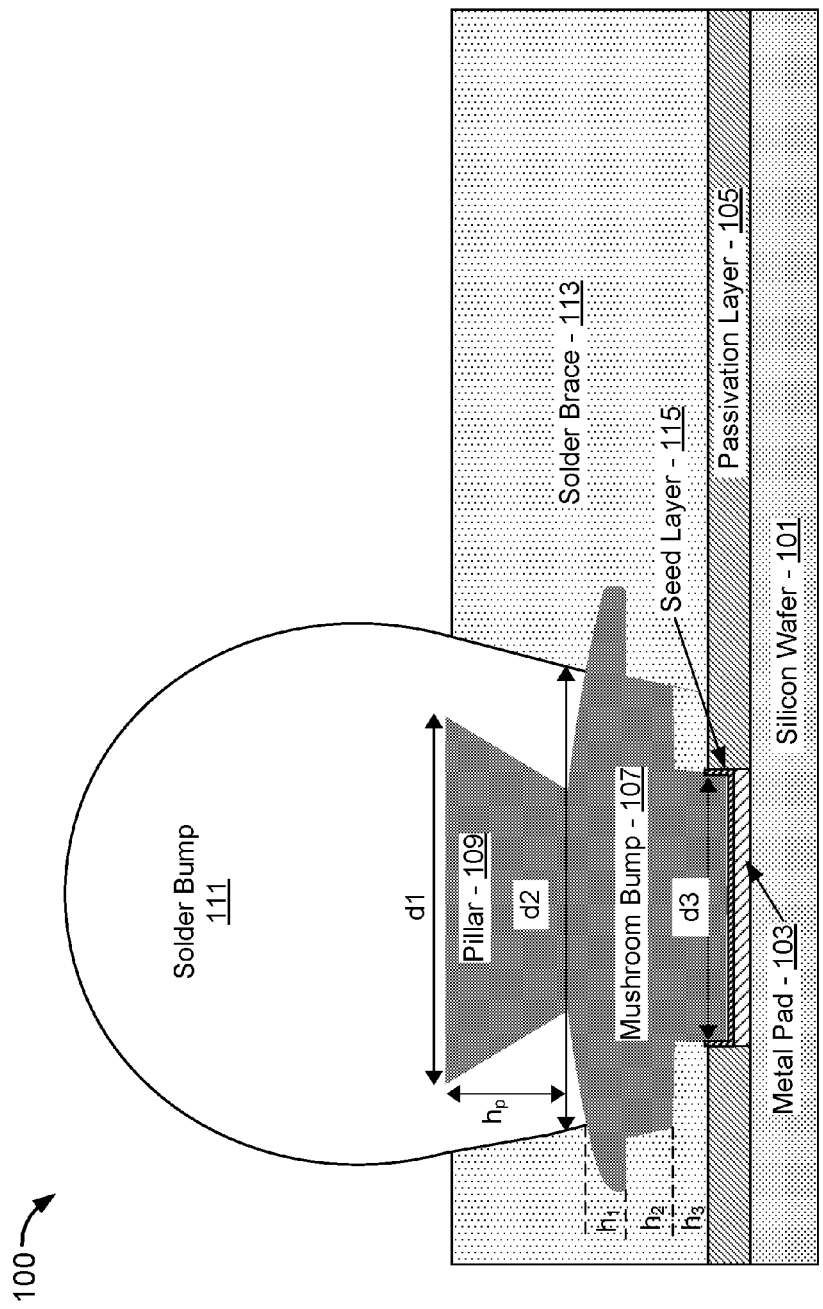
FIG. 1 is a drawing illustrating a pillar on a stepped mushroom shaped post with solder brace, in accordance with an example embodiment of the invention.

FIG. 1 is a drawing illustrating a pillar on a stepped mushroom shaped post with solder brace, in accordance with an example embodiment of the invention. Referring to FIG. 1, there is shown a metal interconnect 100 comprising a pillar 109 on a second metal contact comprising a stepped mushroom shaped bump 107 electrically connected to the metal pad 103. The mushroom shaped bump 107 may comprise a thick layer of copper fabricated in multiple steps to result in the tapered step shape shown in FIG. 1. There is also shown a solder bump 111 formed above and around the sides of the pillar 109. Pillar 109 may comprise a copper pillar structure formed on the top surface of the mushroom shaped bump 107 for alleviating thermal stress in the metal interconnect 100 by introducing a "zig-zag" shaped interface between the copper of the mushroom shaped bump 107/ pillar 109 and the solder bump 111.

The integration of the pillar 109 on the mushroom shaped bump 107 and in the solder bump 111 may result in increased solder joint reliability (SJR) The pillar 109 may, for example, have a tapered sidewall with an upper width larger than a lower width. Alternatively, for example, the pillar may have other types of tapered sidewalls and/or vertical sidewalls. The use of pillar 109 may result in better SJR for wafer-level packaging technologies as the robust pillar-like structure helps to delay failure/crack propagation during field use resulting in enhanced joint reliability. Also, due to the increased Cu thickness, this may improve electromigration performance of the joints.

The ratio of the width of the pillar 109, indicated by d1, to the width of the solder bump 111, indicated by d2, may be varied to optimize the improvement in the SJR. Similarly, the height of the pillar 109, indicated as $h_p$, may also be varied in optimizing SJR. In an example scenario, the width of pillar 109, d1, may equal the width of the metal pad 103, shown as d3. In an example embodiment, the height of the steps of the mushroom shaped bump may be 10 microns, and the height of pillar 109 may be 20-30 microns.

A passivation layer 105 and a solder brace layer 113 may surround the mushroom shaped bump 107. The passivation layer 105 may comprise an insulating dielectric material on the surface of the silicon wafer 101. The passivation layer 105 may provide electrical and mechanical isolation for the various devices and conductive layers at the surface of the silicon wafer 101, while openings in the passivation layer 105 allow for metal pads such as the metal pad 103 and seed layer 115 to provide electrical connection between circuitry in the wafer 101 and external devices or circuitry via the mushroom shaped bump 107, pillar 109, and the solder bump 111.

The solder brace layer 113 may fill in underneath the stepped sidewall of the mushroom shaped bump 107 and may comprise an insulating dielectric material that may be more rigid than polyimide materials. Solder brace may refer to a unique type of repassivation that may eliminate the need for underfill and may be used to improve the reliability of the solder joints between the chip (integrated circuit and package) and the circuit board. Solder brace materials may have several unique properties that make them different from other repassivation materials.

It should be understood that the shape of the mushroom shaped bump 107 with pillar 109 shown in FIG. 1 is just one example of the use of a pillar for improved SJR, and the types of contacts contemplated by this disclosure are not limited to the mushroom shaped bump in FIG. 1. An example detailed process flow for such a structure is illustrated in FIG. 10.

The silicon wafer 101 may comprise a customer-supplied wafer, for example, with a plurality of integrated circuit die, where the metal pad 103 provides an electrical contact to the circuitry in the silicon wafer 101. The silicon wafer 101 may be processed using a wafer-level chip-scale process (WLCSP), which may involve depositing metal contact layers and/or bumps, for example consisting of copper layer structures that are thick enough for receiving a solder ball 110 and withstanding a reflow process without being depleted in the process. The silicon wafer 101 may then be subjected to a thermal cycle during which time the solder bump 111 melts and then cools in a well-defined shape on top of the pillar 109 and the mushroom shaped bump 107. The seed layer 115 may also be referred to herein as an under bump metal (UBM).

FIG. 1 also shows a seed layer 115 that may be applied on top of the metal pad 103. The seed layer 115 may be the first layer added in the wafer-level chip scale packaging process. The seed layer 115 may include an adhesion layer, for example, comprised of titanium (Ti) or Ti-Tungsten (TiW), which may serve to adhere the mushroom shaped bump 107 firmly to the silicon wafer 101 while still being electrically conductive. The seed layer 115 may also include another conductive layer, for example, comprised of a metal such as copper.

The final integrated circuit and package may be mounted on a circuit board using heat to melt the solder bumps, such as the solder bump 111, and attach the integrated circuit and package (collectively, the "chip") to the circuit board. An underfill material may be inserted between the chip and the circuit board, for example to deal with the differences in thermal expansion coefficients between the chip and the circuit board that may lead to undesirable pressure on one or more bumps of the chip package. The underfill material may act like glue, holding the chip firmly to the circuit board, absorbing some pressure and resisting expansion of the board in the area of the chip. Portions of the present disclosure describe one or more systems, methods, routines and/or techniques for forming a pillar on a mushroom shaped bump. In some embodiments, the vertical thickness, $h_p$, and the width at the top and bottom of the pillar, may be important, for example, to optimize SJR (Solder Joint Reliability). In addition, pillar 109 may improve electromigration issues due to the increased copper thickness and the reduced width of the opening in the passivation layer 105 in conjunction with the mushroom shaped bump 107 and solder brace 113 may further improve SJR.

Figure 2:
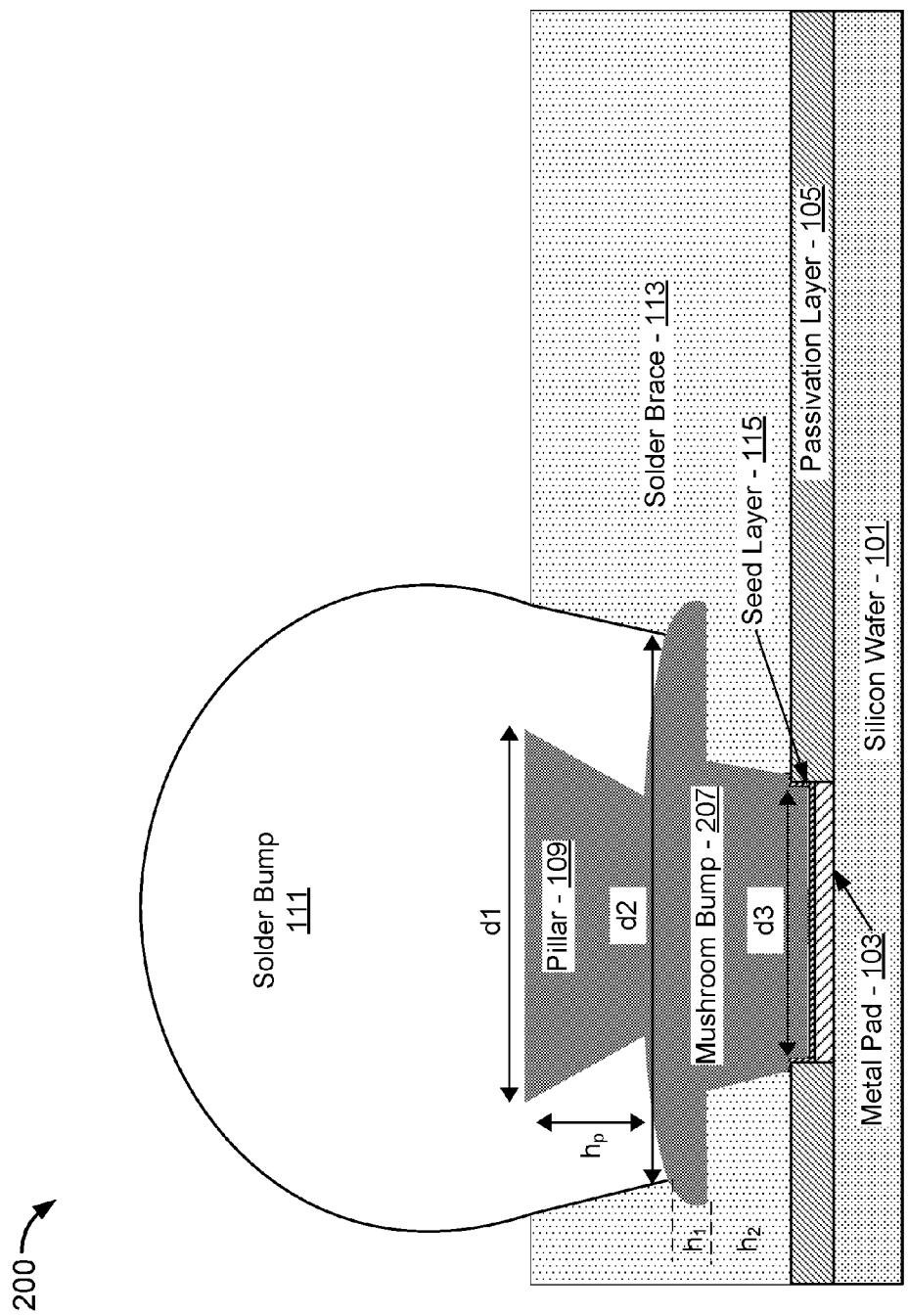
FIG. 2 is a drawing illustrating a pillar on a tapered mushroom shaped post with solder brace, in accordance with an example embodiment of the invention.

FIG. 2 is a drawing illustrating a pillar on a tapered mushroom shaped post with solder brace, in accordance with an example embodiment of the invention. Referring to FIG. 2, there is shown a metal interconnect 200 comprising the solder bump 111, pillar 109, a mushroom shaped bump 207, the seed layer 115 and the metal pad 103. There is also shown the silicon wafer 101, the passivation layer 105, and the solder brace layer 113. Like-numbered elements of FIG. 2 are substantially similar to those shown in FIG. 1, and the mushroom shaped bump 207 may be substantially similar to the mushroom shaped bump shown in FIG. 1, but with a tapered sidewall as opposed to a stepped sidewall.

As with the stepped sidewall mushroom shaped bump structure of FIG. 1, the ratio of the width of pillar 109, d1, to the width of the solder bump 111, d2, may be varied to optimize the improvement in the SJR. Similarly, the height of pillar 109, $h_p$, may also be varied in optimizing SJR. In an example scenario, the width of pillar 109, d1, may equal the width of the metal pad 103, d3. In another example scenario, the height of the "lip", h1, of the mushroom shaped bump 207 may be 10 microns and the height of the tapered "stem," h2, of the mushroom shaped bump 207 may be 20 microns, while the height, $h_p$, of pillar 109 may be 20-30 microns.

The "necking" or tapering of the mushroom shaped bump 207 may improve SJR due to the reduced via size in the passivation layer 105 and increased solder bump layer opening above the mushroom shaped bump 207.

Figure 3:
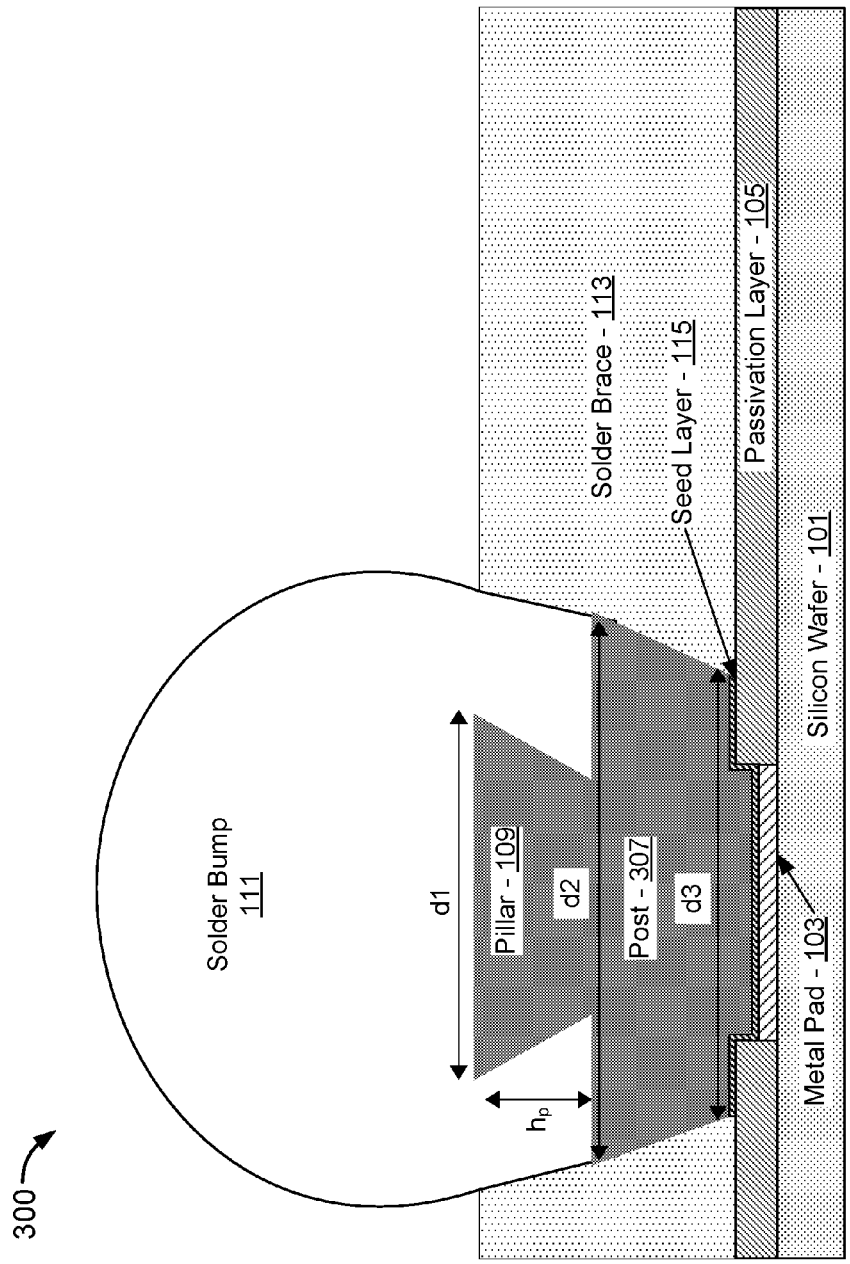
FIG. 3 is a drawing illustrating a pillar on a cylindrical post with solder brace, in accordance with an example embodiment of the invention.

FIG. 3 is a drawing illustrating a pillar on a cylindrical post with solder brace, in accordance with an example embodiment of the invention. Referring to FIG. 3, there is shown a metal interconnect 300 comprising the solder bump 111, the pillar 109, a second metal contact comprising a cylindrical post 307, and the metal pad 103. There is also shown the silicon wafer 101, the passivation layer 105, and the solder brace layer 113. Like-numbered elements of FIG. 3 are substantially similar to those shown in FIGS. 1 and 2. The cylindrical post 307 may comprise a cylindrical copper post with a tapered sidewall as opposed to the mushroom shaped bumps of FIGS. 1 and 2.

As with the stepped sidewall mushroom shaped bump structure of FIG. 1 or the tapered mushroom shaped bump 209 of FIG. 2, the ratio of the width of pillar 109, d1, to the width of the solder bump 111, d2, may be varied to optimize the improvement in the SJR. Similarly, the height of pillar 109, $h_p$, may also be varied in optimizing SJR. In an example scenario, the width of pillar 109, d1, may equal the width of the metal pad 103, d3. In another example scenario, the height of the cylindrical post 307 may be 30 microns, while the height, $h_p$, of pillar 109 may be 20-30 microns.

Figure 4:
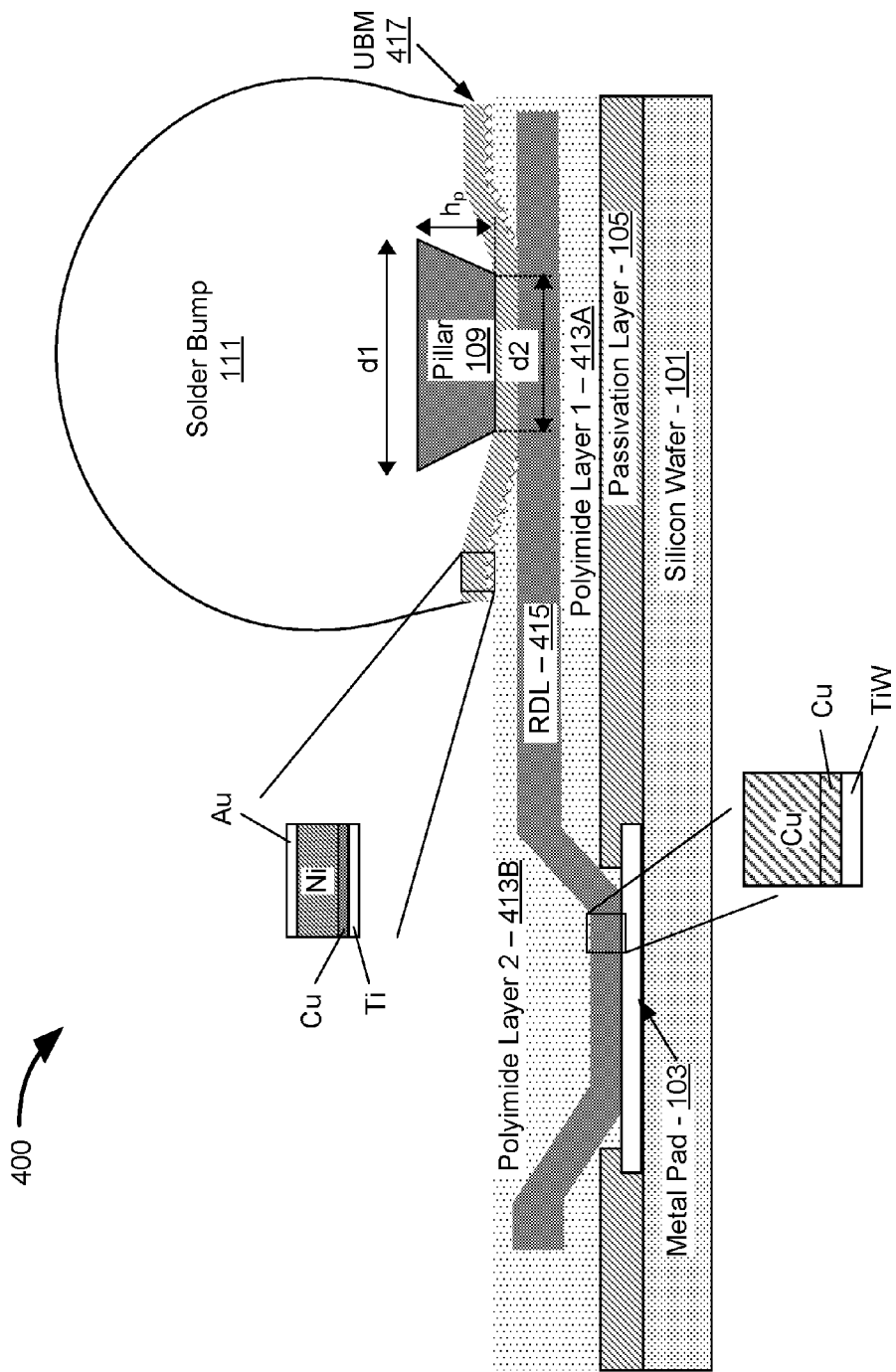
FIG. 4 is a drawing illustrating a pillar used in a redistribution layer contact with under bump metal, in accordance with an example embodiment of the invention.

FIG. 4 is a drawing illustrating a pillar used in a redistribution layer contact with under bump metal, in accordance with an example embodiment of the invention. Referring to FIG. 4, there is shown a metal interconnect 400 comprising the solder bump 111, pillar 109, an under bump metal (UBM) 417, and a second metal contact comprising a redistribution layer (RDL) 415. There is also shown the silicon wafer 101, the metal pad 103, the passivation layer 105, and polyimide layers 413A and 413B. The insets show example metal stacks for the RDL 415 comprising a copper/titanium/tungsten stack and the UBM 417 comprising a gold layer on plated nickel with a copper/titanium seed layer.

The RDL 415 may comprise a copper conductive path that provides electrical connectivity between the solder bump 111 and the metal pad 103 and may extend to multiple levels in the metal/dielectric layers on the silicon wafer 101. In this manner, the solder bumps may be placed in locations away from metal pads on the wafer so that a high-density array of solder balls may be utilized independent of the location of the metal pads.

The polyimide layers 413A and 413B may comprise dielectric layers for providing insulation between various RDL traces and layers. In another example scenario, the polyimide layers may instead comprise another polymer such as polybenzoxale (PBO).

The UBM 417 may comprise a metal layer stack for providing a good mechanical and electrical connection between the solder bump 111 and the RDL 415. The concave shape of the UBM 417 due to the polyimide layer 2 413B may assist in creating the round solder bump shape following a reflow process.

As with the mushroom shaped bump embodiments shown in FIGS. 1-3, pillar 109 may improve solder joint reliability by providing a "zig-zag" interface between the solder bump 111 and the UBM 417. The height, $h_p$, of the pillar 109 and the ratio of the width, d1, at the top of pillar 109 to the width, d2, at the bottom may be varied to optimize SJR. Lateral strain caused by different coefficients of thermal expansion of the silicon wafer 101 and a package or substrate it is bonded to may cause physical failure of conventional contacts. By incorporating the pillar 109 in the solder bump 111, the strain fields may be spread over a larger area with same contact width, and may reduce current crowding.

Figure 5:
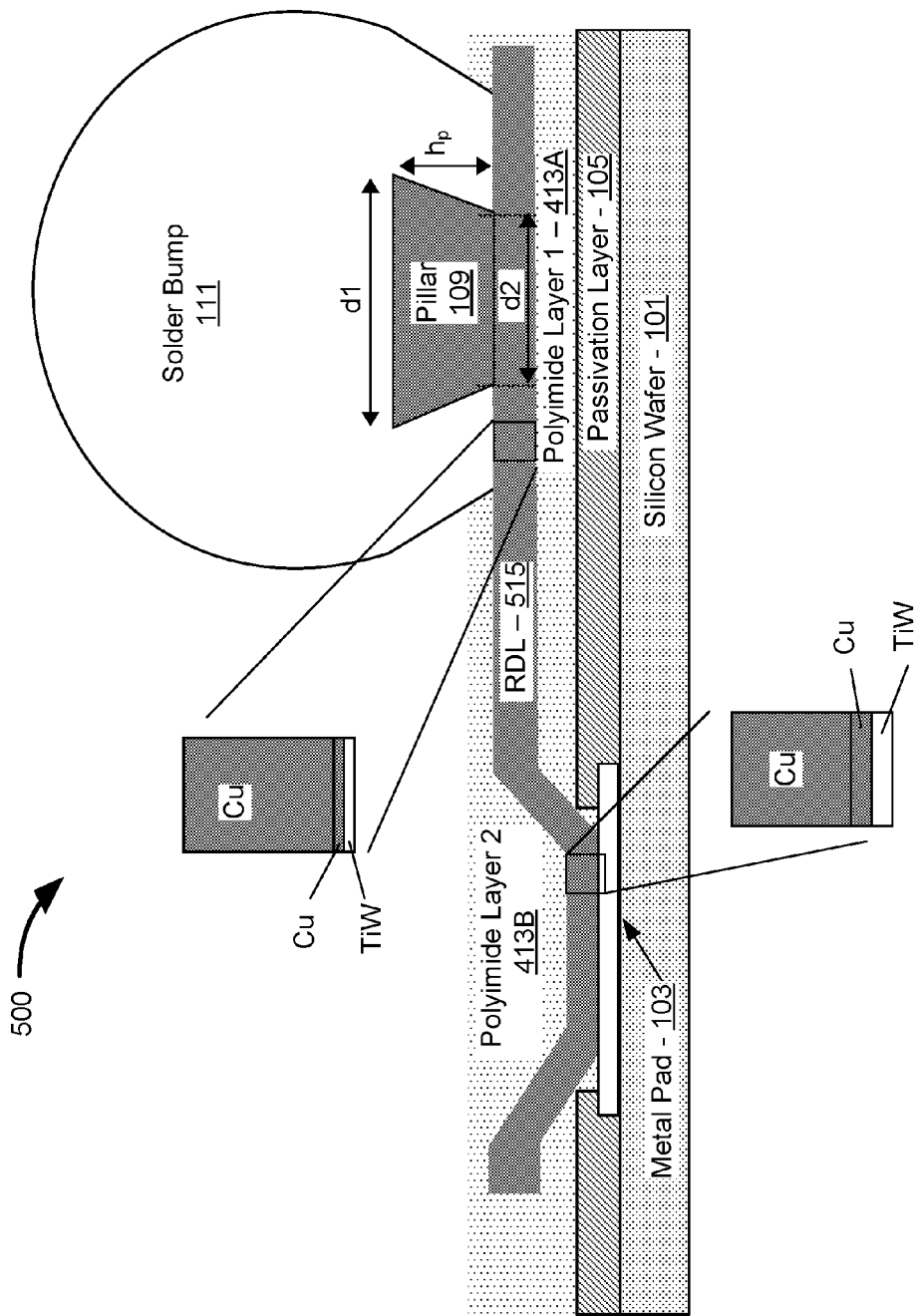
FIG. 5 is a drawing illustrating a pillar used in a redistribution layer contact, in accordance with an example embodiment of the invention.

FIG. 5 is a drawing illustrating a pillar used in a redistribution layer contact, in accordance with an example embodiment of the invention. Referring to FIG. 5, there is shown a metal interconnect 500 comprising the solder bump 111, the pillar 109, and the second metal contact comprising the RDL 515. There is also shown the silicon wafer 101, the metal pad 103, the passivation layer 105, and the polyimide layers 413A and 413B. The insets show example metal stacks for the RDL 515 comprising a copper/titanium/tungsten stack.

In this example scenario, pillar 109 and the solder bump 111 may be placed directly on the RDL 515 without an under bump metal, where the copper in the RDL 515, as shown in the inset, may be significantly thicker than in the RDL 415 shown in FIG. 4. In an example scenario, the copper in the RDL 515 may be on the order of 9 microns thick as compared to 3 microns in the RDL 415.

As with the embodiments shown in FIGS. 1-4, pillar 109 may improve solder joint reliability by providing a "zig-zag" interface between the solder bump 111 and the RDL 515. The height, $h_p$, of the pillar 109 and the ratio of the width, d1, at the top of pillar 109 to the width, d2, at the bottom may be varied to optimize SJR. Lateral strain caused by different coefficients of thermal expansion of the silicon wafer 101 and a package or substrate it is bonded to may cause physical failure of conventional contacts. By incorporating the pillar 109 in the solder bump 111, the strain fields may be spread over a larger area with the same contact width, and may reduce current crowding.

Figure 6:
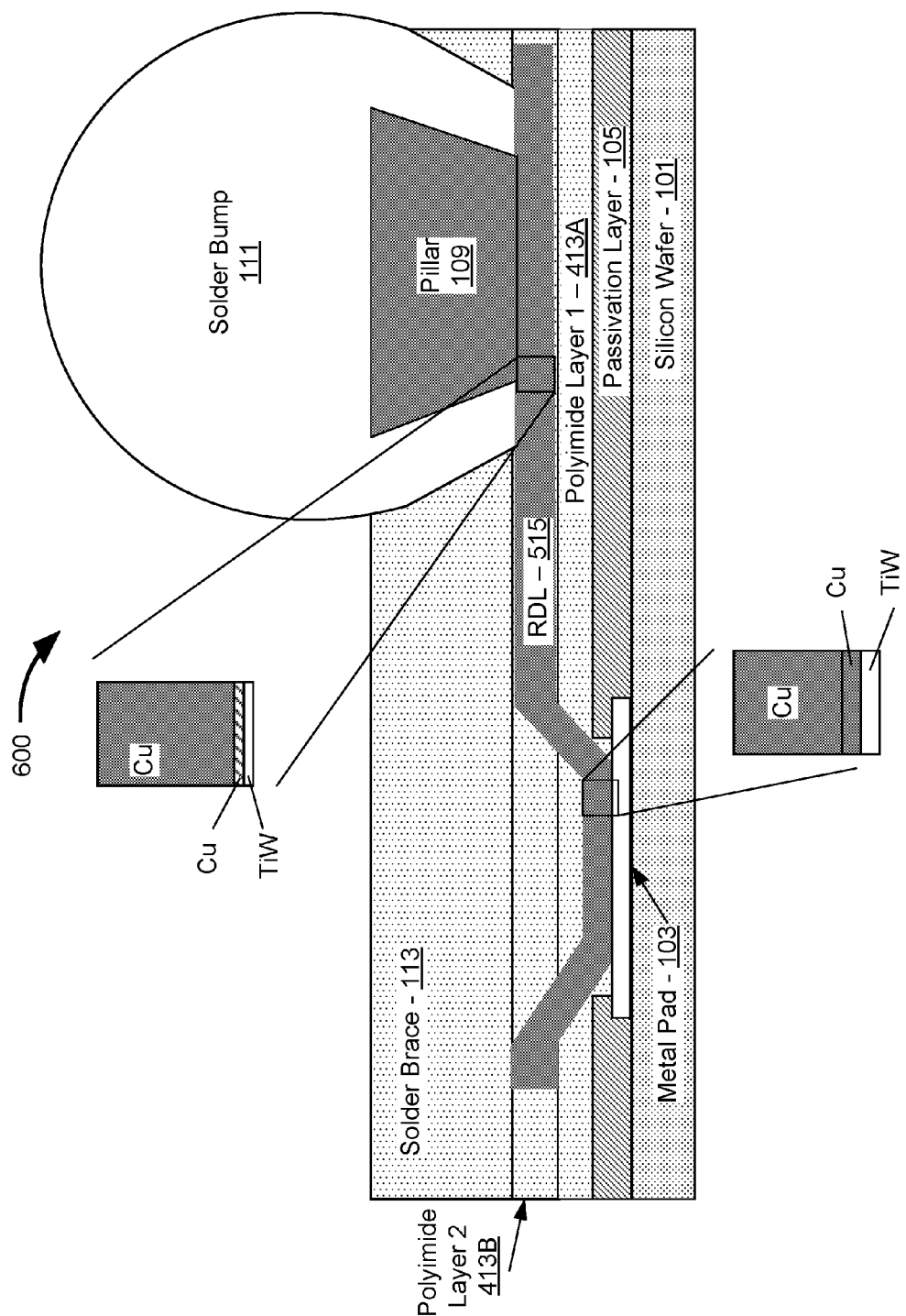
FIG. 6 is a drawing illustrating a pillar used in a redistribution layer contact with solder brace, in accordance with an example embodiment of the invention.

FIG. 6 is a drawing illustrating a pillar used in a redistribution layer contact with solder brace, in accordance with an example embodiment of the invention. Referring to FIG. 6, there is shown a metal interconnect 600 comprising the solder bump 111, the pillar 109, and the second metal contact comprising the RDL 515. There is also shown the silicon wafer 101, the metal pad 103, the passivation layer 105, the solder brace layer 113, and the polyimide layers 413A and 413B. The insets show example metal stacks for the RDL 515 comprising a copper/titanium/tungsten stack.

In this example scenario, pillar 109 and the solder bump 111 may be placed directly on the RDL 515 without an under bump metal, where the copper in the RDL 515, as shown in the inset, may be significantly thicker than in the RDL 415 shown in FIG. 4. In an example scenario, the copper in the RDL 515 may be on the order of 9 microns thick as compared to 3 microns in the RDL 415. Furthermore, the solder brace layer 113 may surround the solder bump 111.

As with the embodiments shown in FIGS. 1-5, pillar 109 may improve solder joint reliability by providing a "zig-zag" interface between the solder bump 111 and the RDL 515. The height, $h_p$, of the pillar 109 and the ratio of the width, d1, at the top of pillar 109 to the width, d2, at the bottom may be varied to optimize SJR. Lateral strain caused by different coefficients of thermal expansion of the silicon wafer 101 and a package or substrate it is bonded to may cause physical failure of conventional contacts. By incorporating the pillar 109 in the solder bump 111, the strain fields may be spread over a larger area with same contact width, and may reduce current crowding.

Additionally, the solder brace layer 113 may surround the solder bump 111 and provide a more rigid structure around the bumps. In an example scenario, the polyimide layers 413A and 413B may be on the order of 5 microns thick and the solder brace layer 113 may be 20-30 microns thick. Solder brace material is much less prone to cracking than is customer passivation or silicon, nitride or the like. In other words, solder brace material is adapted to more effectively absorb stress and strain than is customer passivation or silicon, nitride or the like, which may increase solder joint reliability (SJR).

Figure 7:
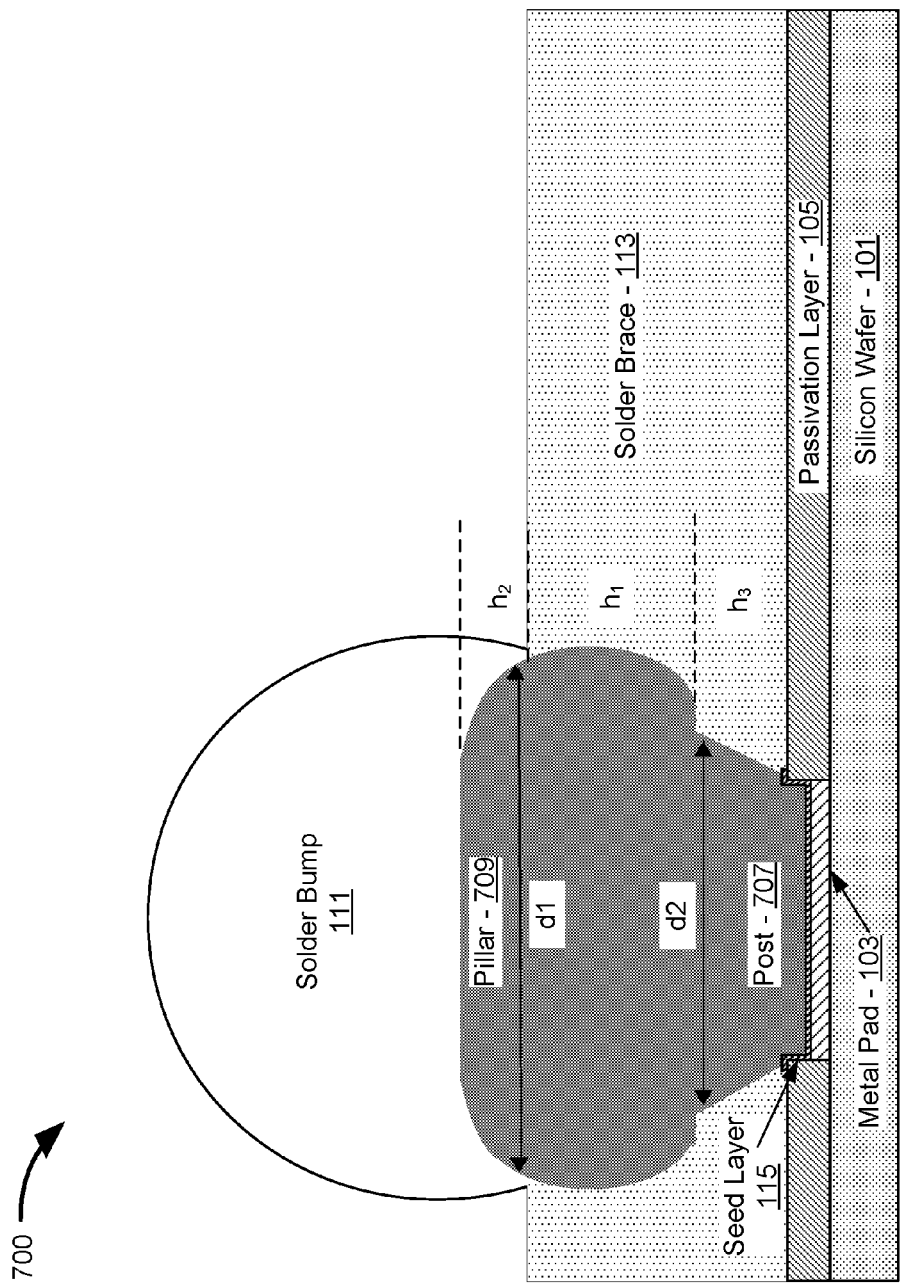
FIG. 7 is a drawing illustrating a thick mushroom shaped pillar with solder brace, in accordance with an example embodiment of the invention.

FIG. 7 is a drawing illustrating a thick mushroom shaped pillar with solder brace, in accordance with an example embodiment of the invention. Referring to FIG. 7, there is shown a metal interconnect 700 comprising the solder bump 111, mushroom shaped pillar comprising the pillar 709, a second metal contact comprising a cylindrical post 707, and the metal pad 103. There is also shown the silicon wafer 101, the passivation layer 105, the solder brace layer 113, and the seed layer 115. Like-numbered elements of FIG. 7 are substantially similar to those shown in FIGS. 1-6. The cylindrical post 707 may comprise a cylindrical copper post with a tapered sidewall that is formed on the seed layer 115 and supports the mushroom shaped pillar 709.

As with the pillars described in FIGS. 1-6, the shape of the mushroom shaped pillar 709, d1, to the width of the solder bump 111, d2, may be varied to optimize the improvement in the SJR. Similarly, the height of pillar 709, $h_p$, that extends into the solder bump 111 may also be varied in optimizing SJR.

Figure 8:
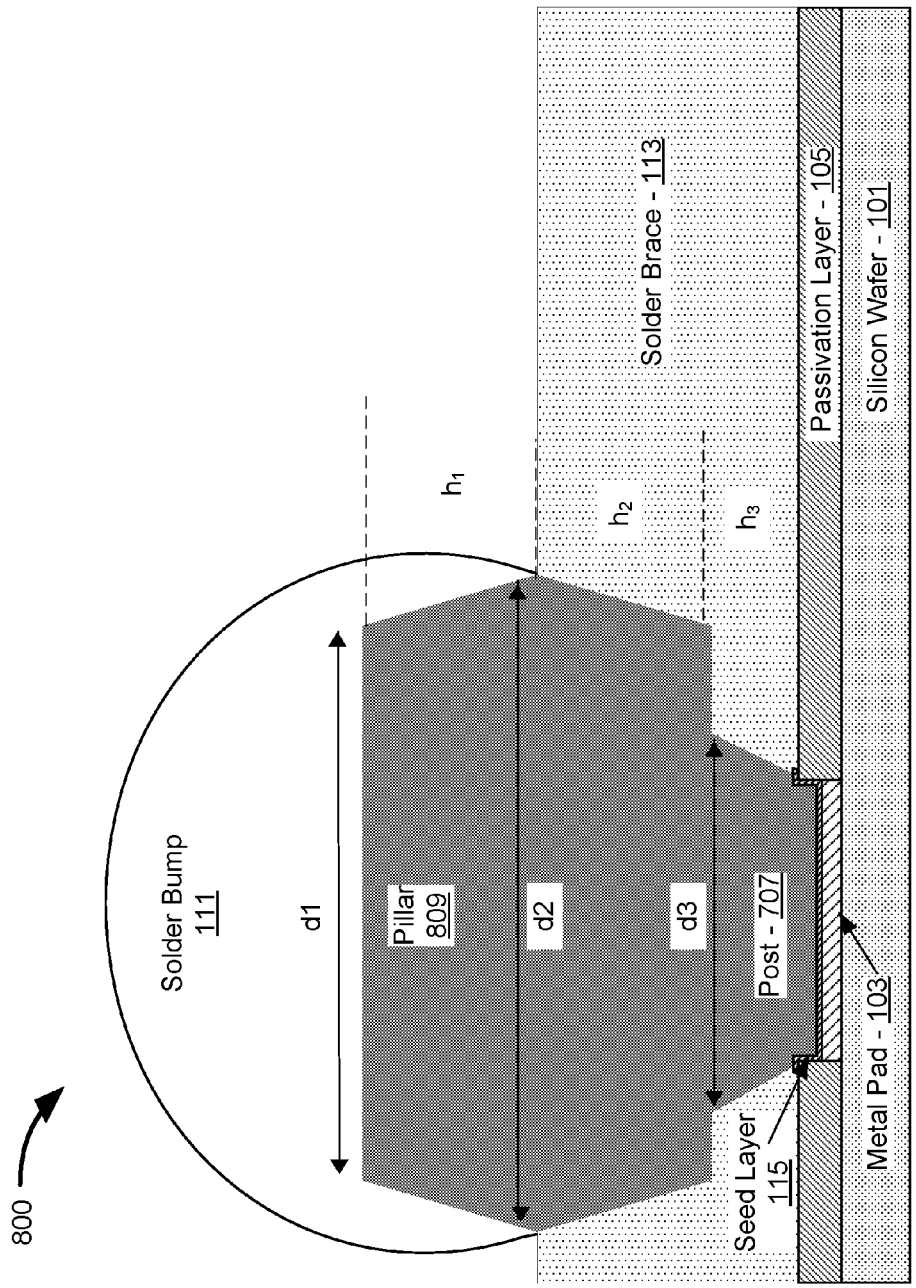
FIG. 8 is a drawing illustrating a sloped mushroom shaped pillar with solder brace, in accordance with an example embodiment of the invention.

FIG. 8 is a drawing illustrating a sloped mushroom shaped pillar with solder brace, in accordance with an example embodiment of the invention. Referring to FIG. 8, there is shown a metal interconnect 800 comprising the solder bump 111, a sloped mushroom shaped pillar comprising the pillar 809, the second metal contact comprising the cylindrical post 707, and the metal pad 103. There is also shown the silicon wafer 101, the passivation layer 105, the solder brace layer 113, and the seed layer 115. Like-numbered elements of FIG. 8 are substantially similar to those shown in FIGS. 1-7. The cylindrical post 707 may comprise a cylindrical copper post with a tapered sidewall that is formed on the seed layer 115 and supports the sloped mushroom shaped pillar 809.

Different embodiments, for example the embodiments of FIGS. 2-8, may achieve different levels of improved SJR, with pillar dimensions, mushroom bump/post complexity, and solder bump dimensions may be varied to determine a preferred SJR when cost and process complexity tradeoffs are considered.

As with the pillars described in FIGS. 1-7, the shape and dimensions of the sloped mushroom shaped pillar 809 may be varied to optimize SJR, where the strain from thermal expansion and contraction may be diffused over a larger interface between the solder bump 111 and the sloped mushroom shaped pillar 809. For example, the height of the sloped mushroom shaped pillar 109, $h_p$, that extends into the solder bump 111 may be varied in optimizing SJR. Similarly, the width of the pillar d1, at the top of the pillar compared to the width of the pillar, d2, at the base of the solder bump 111, may also be varied to optimize the improvement in the SJR. In addition, the utilization of the solder brace layer 113 may enable a narrow opening in the passivation layer 105 while still allowing a larger width, d3, of the top of the cylindrical post 707.

Figure 9:
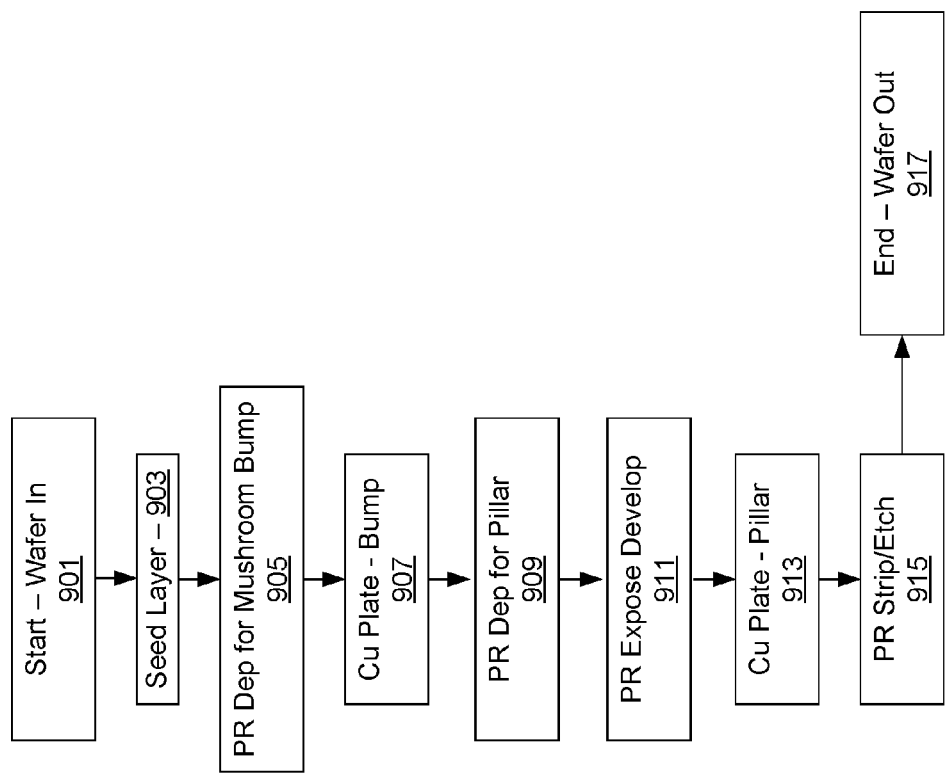
FIG. 9 is a flow diagram illustrating example steps in fabricating a pillar structure in a metal interconnect, in accordance with an embodiment of the invention.

FIG. 9 is a flow diagram illustrating example steps in fabricating a pillar structure in a metal interconnect, in accordance with an embodiment of the invention. FIGS. 10A-10J illustrate the pillar structure process steps of FIG. 9. Referring to FIG. 9, the process begins with start step 901, where a silicon wafer may be input into the process with a passivation layer comprising openings for metal contacts to be formed within, as shown in FIG. 10 A). In step 903, a seed layer 915, comprising seed layers 115A and 115B, may be deposited on the wafer on top of the passivation layer 105 as well as the openings, as shown in FIGS. 10 B) and 10 C). In an example scenario, the seed layer may comprise a copper (seed layer 115A) and titanium/tungsten (seed layer 115B) stack, as shown in FIGS. 10 C) to 10 I).

In step 905, a photoresist layer 1005 may be spun on the deposited seed layer 115 to generate a mask layer for defining a bump structure, as shown in FIG. 10 D), such as a mushroom shaped bump. The photoresist layer 1005 may be exposed to a UV light source through a mask such that exposed photoresist will be removed in a subsequent develop process, in a positive photoresist example. Following development, the wafer may be baked to harden the remaining photoresist, resulting in the structure shown in FIG. 10 E).

Figures 10A, 10B:
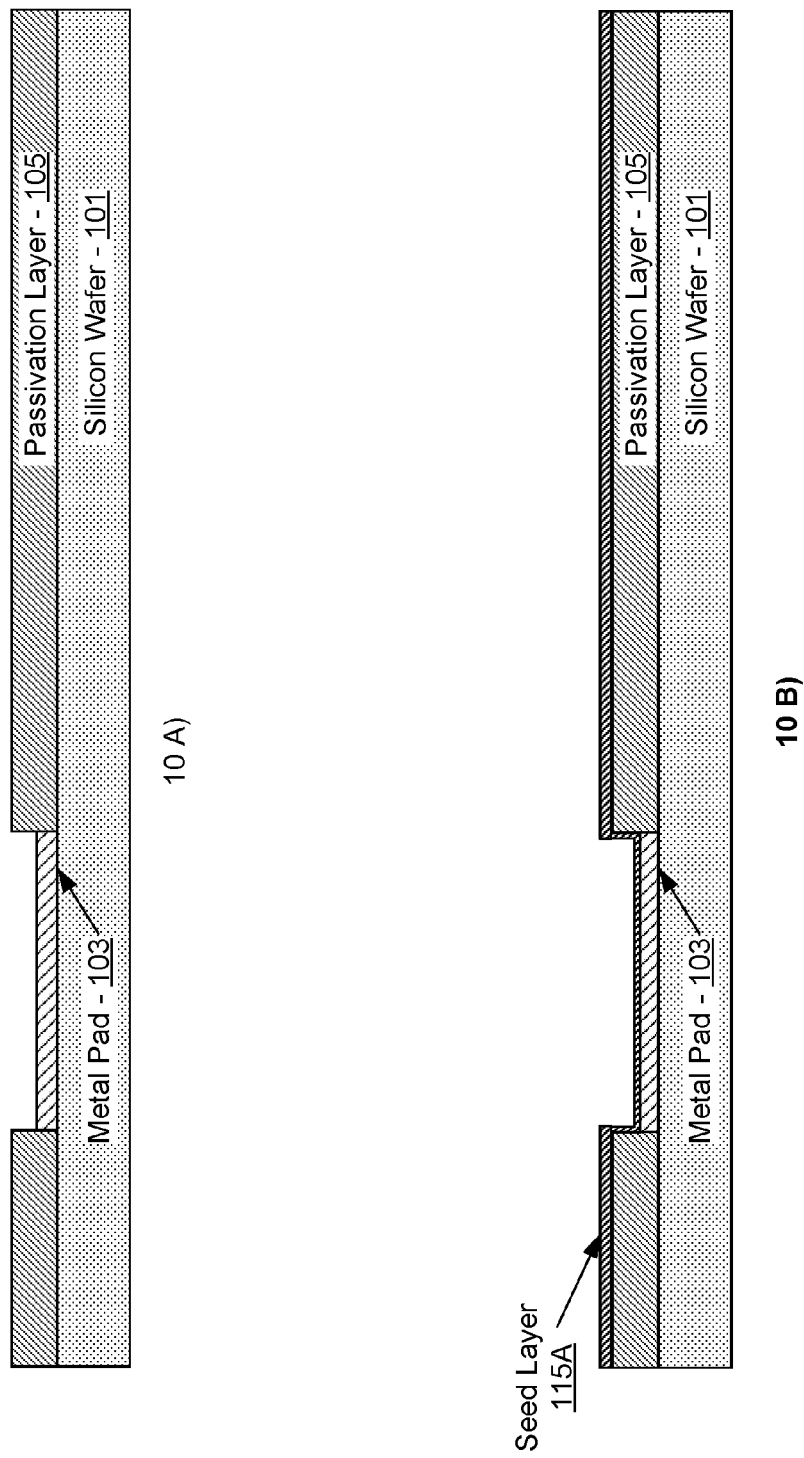
FIGS. 10A-10J illustrate the pillar structure process steps of FIG. 9.
Figure 10C:
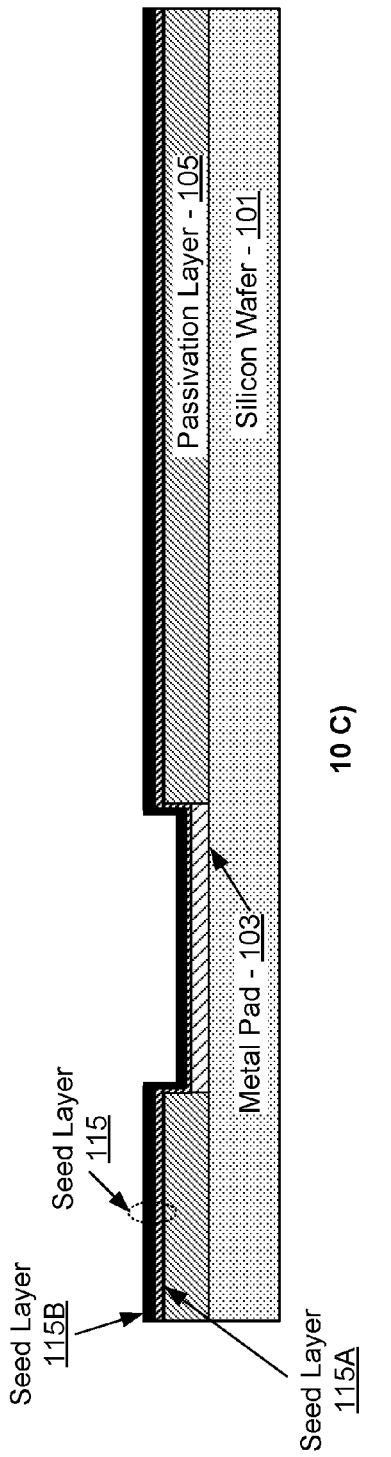
Figure 10D:
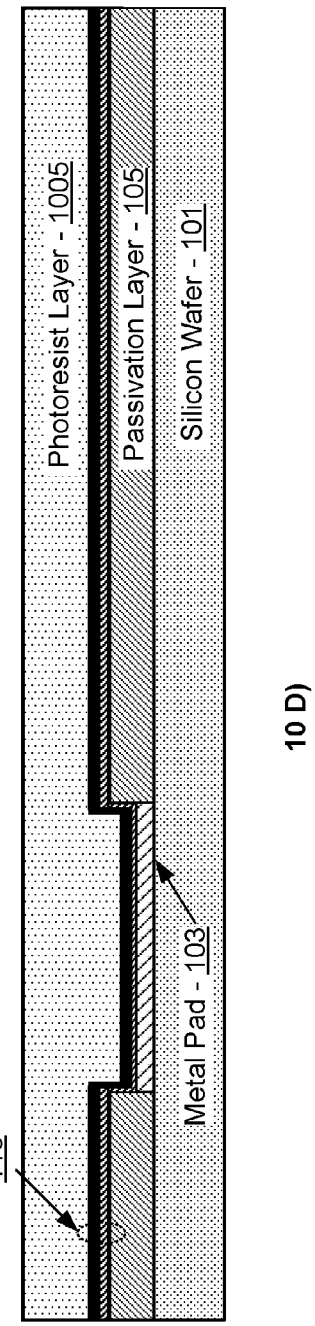
Figures 10E, 10F:
Figures 10G, 10H:
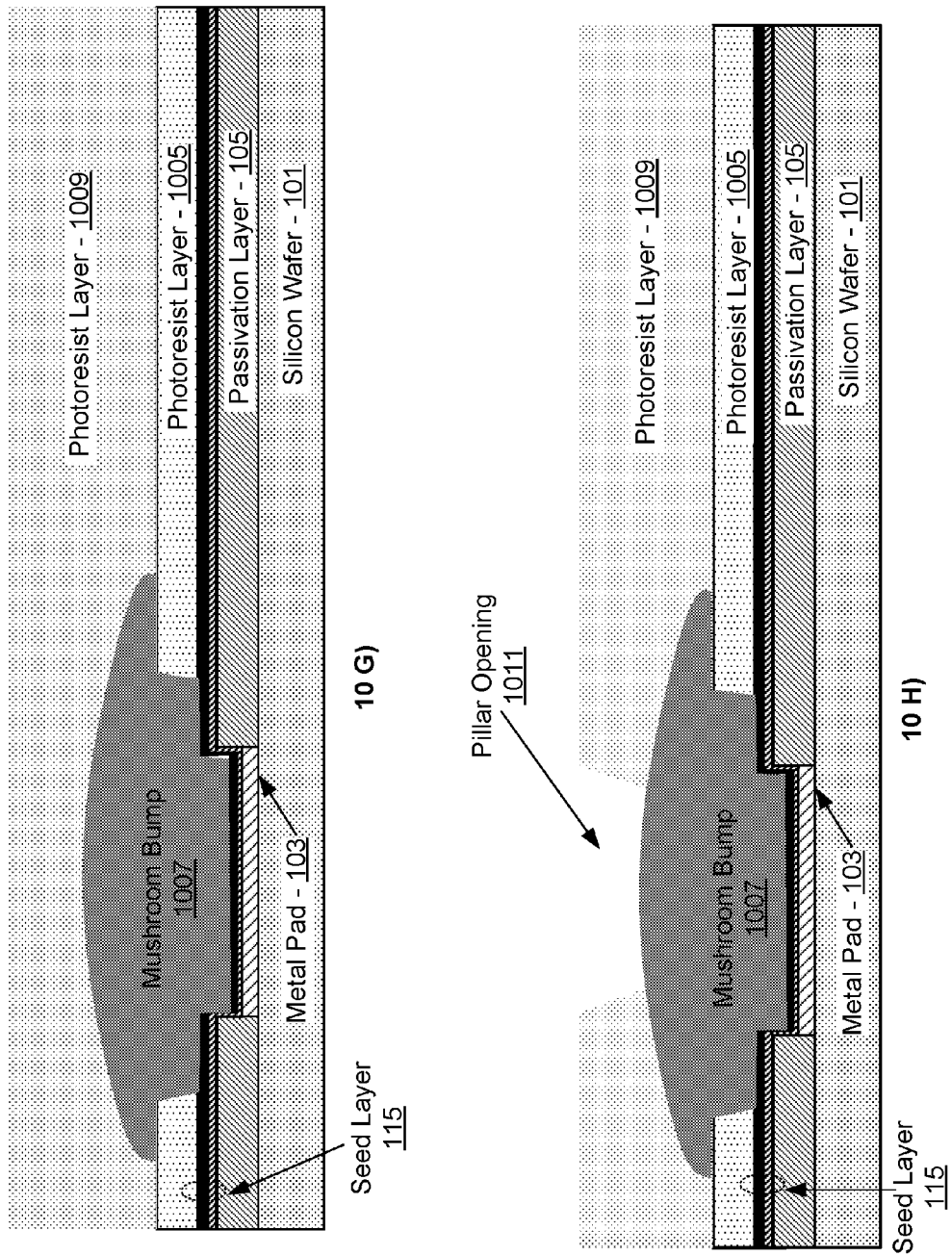
Figures 10I, 10J:
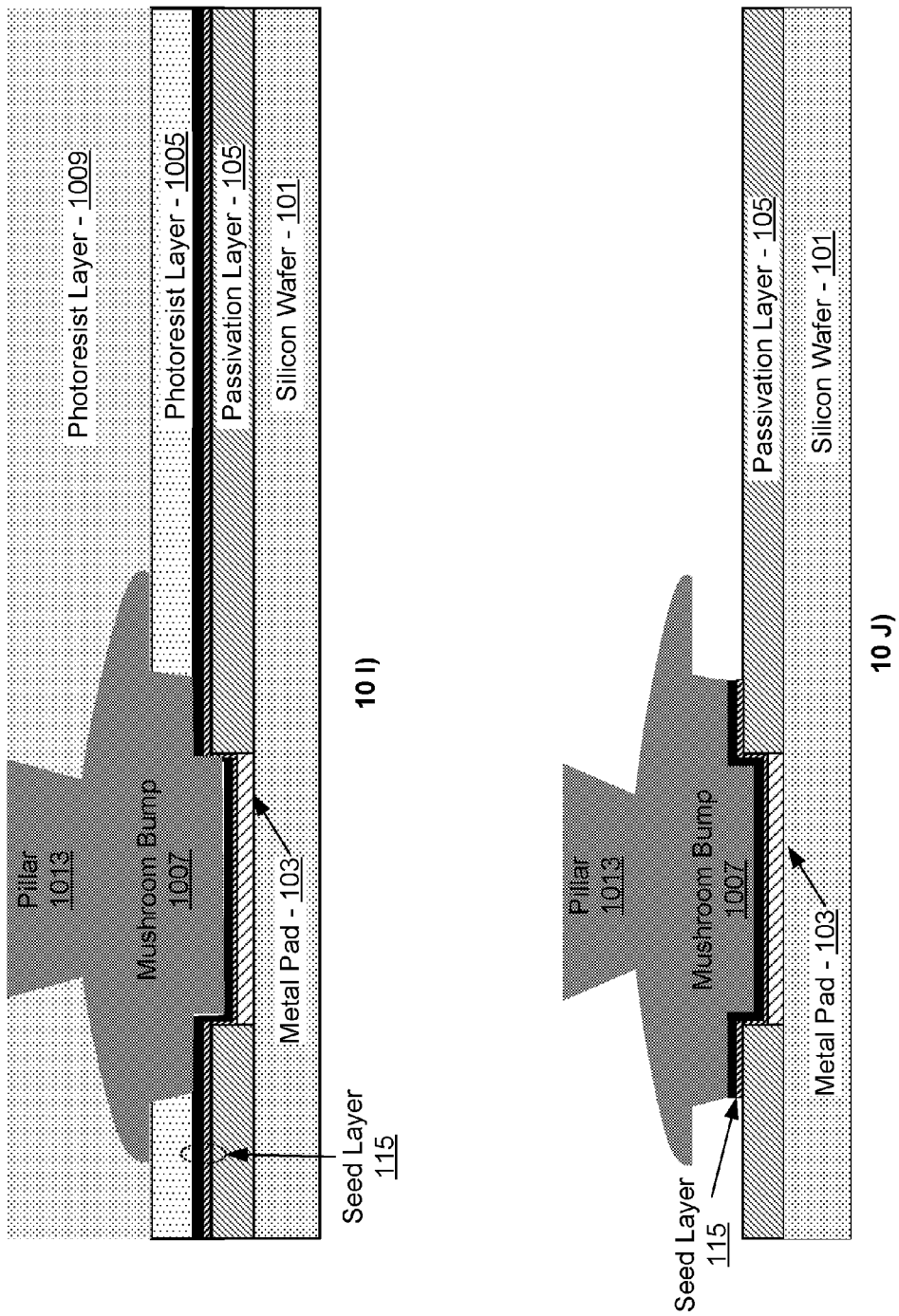

In step 907, copper may be plated/deposited on the PR masked structure, thereby filling in the regions not covered by photoresist, resulting in a mushroom or "nail head" shape within the opening and extending beyond the opening on top of the photoresist layer 1005, as shown in FIG. 10F.

In step 909, a second photoresist layer may be deposited, as shown by photoresist layer 1009 in FIG. 10 G), for defining a pillar structure to extend into a subsequent solder bump. Step 911 comprises a PR expose and develop step, where portions of the photoresist layer may be exposed to an ultraviolet light source through a mask for removal of exposed portions, such as the pillar opening 1011, during a subsequent develop process. Following development, the wafer may be baked to harden the remaining photoresist, resulting in the structure shown in FIG. 10 H).

In step 913 a plating or deposition process may be utilized to fill the pillar opening 1011 with copper, thereby forming a pillar on the mushroom bump 1007, with the resulting pillar 1013 shown in FIGS. 10 I) and 10 J).

In step 915, the photoresist layers 1005 and 1009 may be removed in a photoresist strip process, followed by a metal etch process that may remove the exposed portions of the seed layer 115, such that the only portion of the seed layer 115 remaining is under the mushroom bump 1007. Step 915 is followed by end step 917 where the completed wafer shown in FIG. 10 I) is the output.

In an embodiment of the invention, methods are disclosed for a robust pillar structure for semiconductor device contacts and may comprise processing a semiconductor wafer comprising one or more metal pads, wherein the processing may comprise: forming a second metal contact on the one or more metal pads; forming a pillar on the second metal contact, and forming a solder bump on the second metal contact and the pillar, wherein the pillar extends into the solder bump. The second metal contact may comprise a stepped mushroom shaped bump, a sloped mushroom shaped bump, a cylindrical post, and/or a redistribution layer. The semiconductor wafer may comprise silicon. A solder brace layer may be formed around the second metal contact. The second metal contact may be tapered down to a smaller area at the one or more metal pads on the semiconductor wafer. A seed layer may be formed between the second metal contact and the one or more metal pads on the semiconductor wafer. The pillar may comprise copper.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A device comprising:
a substrate;
a metal pad on a top surface of the substrate;
a conductive layer electrically coupled to the metal pad;
a pillar electrically coupled to the metal pad via the conductive layer;
a covering bump over the pillar and a portion of the conductive layer such that the covering bump contacts the pillar and a horizontal portion of an upper surface of the conductive layer; and
a bracing layer that contacts a lower portion of the covering bump,
wherein the pillar comprises a first portion with a first width and a second portion with a second width, and the first width is larger than the second width, wherein the second portion is below the first portion.

2. The device of claim 1, wherein the conductive layer is concave shaped in a region of the conductive layer that contacts the metal pad.

3. The device of claim 1, wherein the conductive layer comprises multiple layers, and a lowest of the multiple layers comprises a titanium/tungsten layer.

4. A device comprising:
a substrate;
a metal pad on a top surface of the substrate;
a conductive layer electrically coupled to the metal pad;
a pillar electrically coupled to the metal pad via the conductive layer;
a covering bump over the pillar and a portion of the conductive layer such that the covering bump contacts the pillar and a horizontal portion of an upper surface of the conductive layer;
a bracing layer that contacts a lower portion of the covering bump; and
a passivation layer on a portion of the top surface of the substrate.

5. The device of claim 4, wherein the pillar is substantially a trapezoid with a top of the trapezoid wider than a bottom of the trapezoid.

6. The device of claim 4, comprising a first dielectric layer, a portion of which is on a top surface of the passivation layer, and wherein a portion of the conductive layer is on the first dielectric layer.

7. The device of claim 6, comprising a second dielectric layer on a top surface of the first dielectric layer, wherein the bracing layer is on a portion of a top surface of the second dielectric layer.

8. The device of claim 4, wherein the pillar is substantially a trapezoid with a top of the trapezoid wider than a bottom of the trapezoid.

9. The device of claim 4, wherein the pillar comprises a first portion with a first width and a second portion with a second width, the first width is larger than the second width, and the first portion is closer to a top of the pillar than the second portion.

10. The device of claim 4, wherein the conductive layer is concave shaped in region of the conductive layer that contacts the metal pad.

11. The device of claim 4, wherein the conductive layer comprises multiple layers, and a lowest of the multiple layers comprises a titanium/tungsten layer.

12. A device comprising:
   a substrate;
   a metal pad on a top surface of the substrate;
   a conductive layer electrically coupled to the metal pad;
   a pillar electrically coupled to the metal pad via the conductive layer;
   a covering bump over the pillar and a portion of the conductive layer such that the covering bump contacts the pillar and a horizontal portion of an upper surface of the conductive layer; and
   a bracing layer that contacts a lower portion of the covering bump;
   wherein a sidewall of the pillar covered by the covering bump is at an acute angle relative to the conductive layer.

13. The device of claim 12, wherein the pillar is substantially a trapezoid with a top of the trapezoid wider than a bottom of the trapezoid.

14. The device of claim 12, wherein the pillar comprises a first portion with a first width and a second portion with a second width, the first width is larger than the second width, and the first portion is closer to a top of the pillar than the second portion.

15. The device of claim 12, wherein the conductive layer is concave shaped in a region of the conductive layer that contacts the metal pad.

16. The device of claim 12, wherein the conductive layer comprises multiple layers, and a lowest of the multiple layers comprises a titanium/tungsten layer.

17. A device comprising:
   a substrate;
   a passivation layer on a portion of a top surface of the substrate;
   a metal pad on the top surface of the substrate;
   a conductive layer electrically coupled to the metal pad;
   a bump anchor electrically coupled to the metal pad via the conductive layer;
   a covering bump over bump anchor such that the covering bump contacts the bump anchor;
   a bracing layer that contacts a lower portion of the covering bump;
   a first dielectric layer, a portion of which is on a top surface of the passivation layer, and wherein a portion of the conductive layer is on the first dielectric layer; and
   a second dielectric layer on a top surface of the first dielectric layer, wherein the bracing layer is on a portion of a top surface of the second dielectric layer.

18. The device of claim 17, wherein the bracing layer is at least four times thicker than the first dielectric layer.

19. The device of claim 17, wherein the bump anchor is substantially a trapezoid with a top of the trapezoid wider than a bottom of the trapezoid.

20. The device of claim 17, wherein the bump anchor comprises a first portion with a first width and a second portion with a second width, the first width is larger than the second width, and the first portion is closer to a top of the bump anchor than the second portion.

21. The device of claim 17, wherein the conductive layer is concave shaped in a region of the conductive layer that contacts the metal pad.

22. The device of claim 17, wherein the conductive layer comprises multiple layers, and a lowest of the multiple layers comprises a titanium/tungsten layer.

* * * * *